(12) United States Patent
Choi et al.

(10) Patent No.: US 12,740,395 B2
(45) Date of Patent: Sep. 15, 2026

(54) INTEGRATED CIRCUIT DEVICES INCLUDING A CONDUCTIVE VIA AND METHODS OF FORMING THE SAME

(71) Applicant: Samsung Electronics Co., Ltd., Suwon-si (KR)

(72) Inventors: Jaemyung Choi, Niskayuna, NY (US); Kang-Ill Seo, Springfield, VA (US); Se Jung Park, Watervliet, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 385 days.

(21) Appl. No.: 18/459,894

(22) Filed: Sep. 1, 2023

(65) Prior Publication Data

US 2024/0355727 A1 Oct. 24, 2024

Related U.S. Application Data

(60) Provisional application No. 63/497,807, filed on Apr. 24, 2023.

(51) Int. Cl.

*H10W 20/42* (2026.01)
*H10W 20/00* (2026.01)
*H10W 20/41* (2026.01)

(52) U.S. Cl.

CPC ......... *H10W 20/42* (2026.01); *H10W 20/039* (2026.01); *H10W 20/063* (2026.01); *H10W 20/425* (2026.01)

(58) Field of Classification Search

CPC .... H10D 89/10; H10W 20/01; H10W 20/031; H10W 20/033; H10W 20/037; H10W 20/039; H10W 20/0698; H10W 20/42; H10W 20/435; H10W 20/4432; H10W 20/4441

See application file for complete search history.

(56) References Cited

U.S. PATENT DOCUMENTS 11,276,611 B2 3/2022 Anderson et al.
2013/0193579 A1 8/2013 Ponoth et al.
2018/0151504 A1 5/2018 Zhang et al.
2020/0219808 A1* 7/2020 Hwang ................. H10W 20/42
2022/0238433 A1* 7/2022 Shin ...................... H10W 20/42
2022/0352068 A1 11/2022 Lin et al.
2023/0084739 A1 3/2023 Metzler et al.
2023/0102662 A1 3/2023 Li et al.
2023/0369111 A1* 11/2023 Choi ................... H10W 20/077
2025/0006641 A1* 1/2025 Kang ................. H10W 20/071
2025/0316582 A1* 10/2025 Lee ..................... H10W 20/037

* cited by examiner

*Primary Examiner* — Fazli Erdem
(74) *Attorney, Agent, or Firm* — Myers Bigel, P.A.

(57) ABSTRACT

Integrated circuit devices and methods of forming the same are provided. The integrated circuit devices may include a lower metal wire, an upper metal wire on the lower metal wire, a metal via between the lower metal wire and the upper metal wire, the metal via including a lower surface and an upper surface that respectively contact the lower metal wire and the upper metal wire, and a barrier layer extending on a side surface of the metal via. An upper portion of the barrier layer may extend upwardly beyond a lower surface of the upper metal wire.

20 Claims, 17 Drawing Sheets

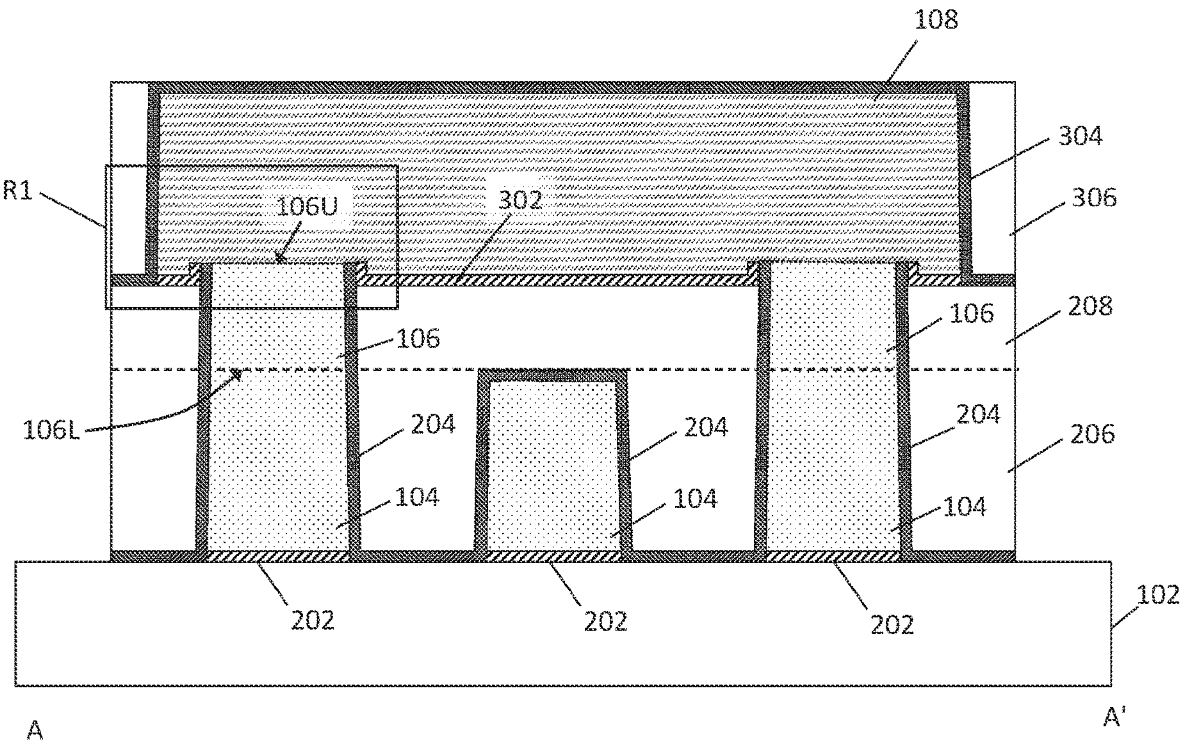
FIG. 2
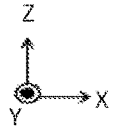

INTEGRATED CIRCUIT DEVICES INCLUDING A CONDUCTIVE VIA AND METHODS OF FORMING THE SAME

CROSS-REFERENCE TO RELATED APPLICATION

This application claims priority to U.S. Provisional Application Ser. No. 63/497,807 entitled DEVICES INCLUDING AN INTERFACE-LESS VIA AND METHODS OF FORMING THE SAME, filed in the USPTO on Apr. 24, 2023, the disclosure of which is hereby incorporated by reference herein in its entirety.

BACKGROUND

The present disclosure generally relates to the field of electronics and, more particularly, to integrated circuit devices.

Various back end of line (BEOL) structures of an integrated circuit device with different configurations and materials have been suggested to reduce resistance thereof so as to improve the performance (e.g., the operation speed) of the integrated circuit device.

SUMMARY

According to some embodiments, integrated circuit devices may include a lower metal wire; an upper metal wire on the lower metal wire; a metal via between the lower metal wire and the upper metal wire, the metal via including a lower surface and an upper surface that respectively contact the lower metal wire and the upper metal wire; and a barrier layer extending on a side surface of the metal via. An upper portion of the barrier layer may extend upwardly beyond a lower surface of the upper metal wire.

According to some embodiments, integrated circuit devices may include an insulating layer; a metal via in the insulating layer; an upper metal wire on the insulating layer and the metal via, an upper surface of the metal via contacting the upper metal wire; and a barrier layer extending on a side surface of the metal via. An upper portion of the barrier layer may be in the upper metal wire.

According to some embodiments, methods of forming an integrated circuit devices may include forming a metal via, a barrier layer and a first insulating layer. The metal via and the barrier layer may be the first insulating layer, and the barrier layer may extend between the first insulating layer and opposing side surfaces of the metal via, and upper portions of the metal via and the barrier layer may protrude upwardly beyond an upper surface of the first insulating layer. The method may also include forming an adhesion layer on the upper surface of the first insulating layer and forming an upper metal wire on the metal via, the barrier layer and the adhesion layer. The adhesion layer may not overlap an upper surface of the metal via. The upper metal wire may contact the upper surface of the metal via and an upper surface of the barrier layer.

BRIEF DESCRIPTION OF THE DRAWINGS

FIG. 2 is a cross-sectional view taken along the line A-A in FIG. 1B according to some embodiments.

DETAILED DESCRIPTION

Metal(s) (e.g., ruthenium (Ru), molybdenum (Mo), tungsten (W), aluminum (Al) and/or copper (Cu)) may be used to form conductive elements (e.g., a via or a wire) in a BEOL process to reduce resistance thereof. An adhesion layer may be formed between those conductive elements and adjacent elements for improved adhesion therebetween, and a barrier layer (also referred to as a diffusion barrier layer) maybe formed between those conductive elements and adjacent elements for reduced diffusion of elements of those conductive elements to those adjacent elements. The adhesion layer and the barrier layer may have a resistance higher than the conductive elements and thus may increase a resistance of a conductive structure of a BEOL structure if those adhesion layer and barrier layer are formed between conductive elements of the BEOL structure.

According to some embodiments, lower and upper conductive elements (e.g., a lower via and an upper conductive wire) may include the same metal element and may be connected to each other without any intervening layer (e.g., a portion of an adhesion layer and/or a portion of a barrier layer). Accordingly, a conductive structure including those lower and upper conductive elements may have relatively low resistance.

Figure 1A:
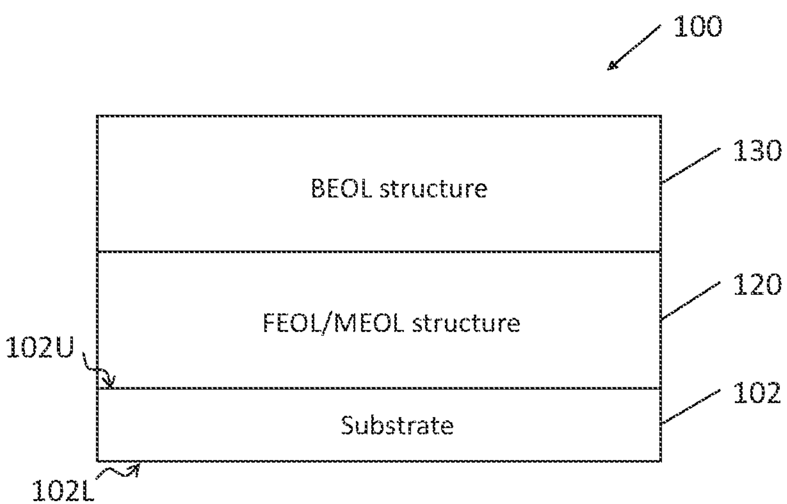
FIG. 1A is a diagram illustrating an integrated circuit device according to some embodiments.

FIG. 1A is a diagram illustrating an integrated circuit device 100 according to some embodiments. The integrated circuit device 100 may include a substrate 102, a front-end-of-line (FEOL)/middle-end-of-line (MEOL) structure 120 that includes elements formed during FEOL and MEOL processes, and a BEOL structure 130 that includes elements formed during a BEOL process. For example, the FEOL/MEOL structure 120 includes transistors, and/or capacitors, and the BEOL structure 130 includes metal wires and/or metal vias.

The substrate 102 may include an upper surface 102U facing the FEOL/MEOL structure 120 and a lower surface 102L opposite the upper surface 102U of the substrate 102. The upper surface 102U and/or the lower surface 102L of the substrate 102 may be parallel to a first direction X (also referred to as a first horizontal direction) and a second direction Y (also referred to as a second horizontal direction). In some embodiments, the first horizontal direction X and the second horizontal direction Y may be perpendicular to each other. The substrate 102 and the BEOL structure 130 may be spaced apart from each other in a third direction Z (also referred to as a vertical direction), and the FEOL/MEOL structure 120 may be provided between the substrate 102 and the BEOL structure 130. In some embodiments, the third direction Z may be perpendicular to the upper surface 102U and/or the lower surface 102L of the substrate 102.

Figure 1B:
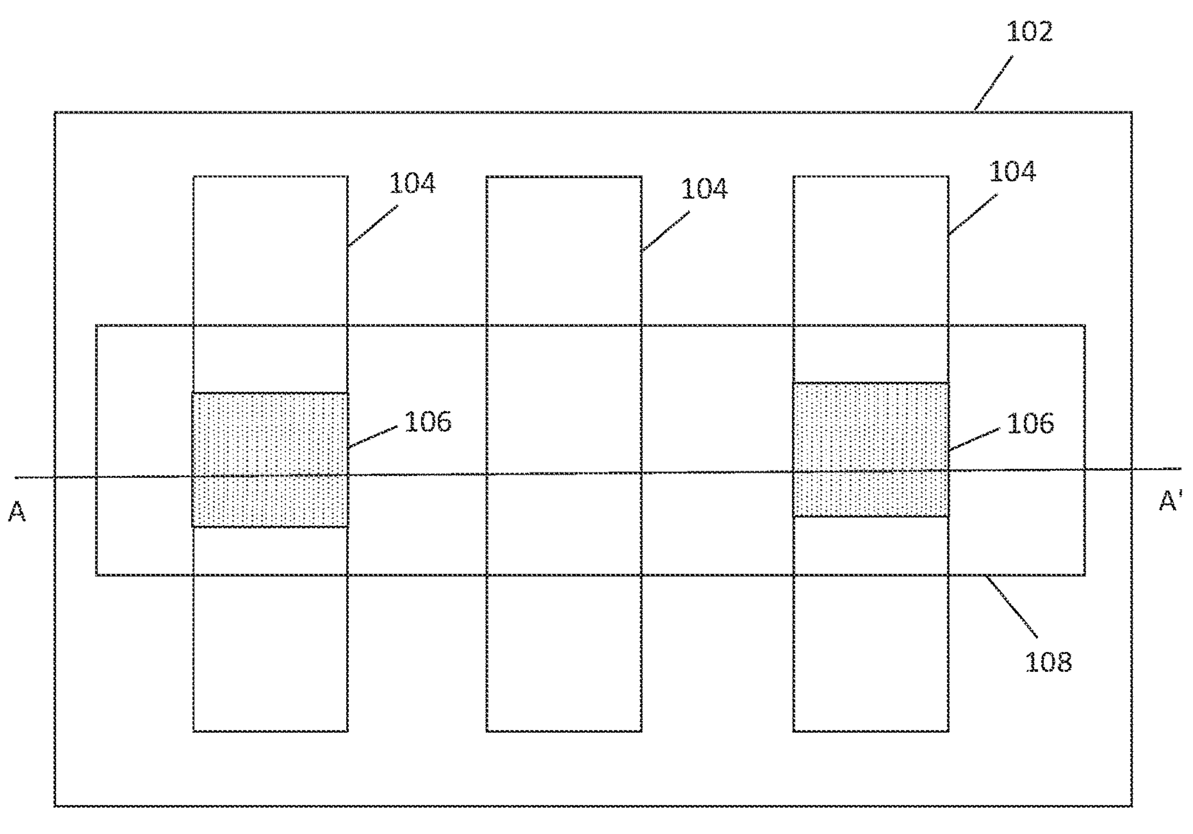
FIG. 1B is a layout of a BEOL structure of an integrated circuit device according to some embodiments.
Figure 3:
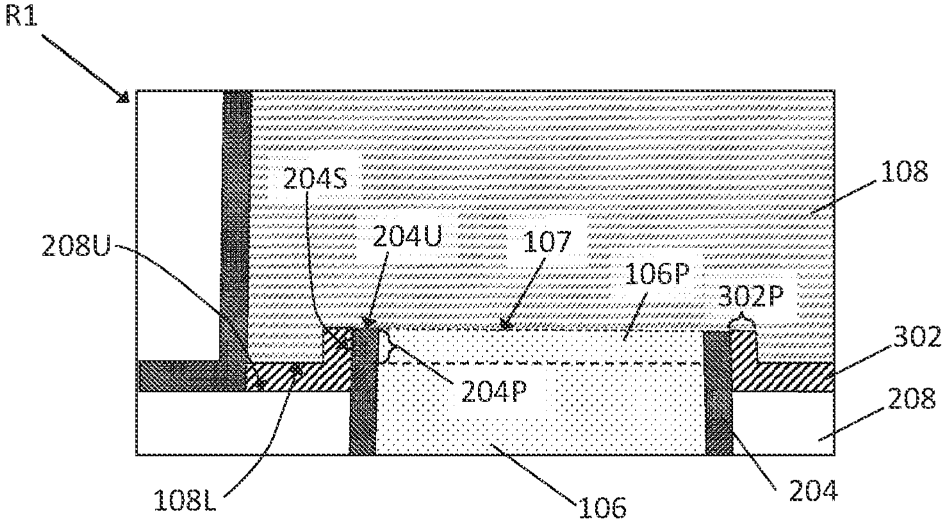
FIG. 3 is an enlarged view of a first region R1 in FIG. 2 according to some embodiments.

FIG. 1B is a layout of a BEOL structure of an integrated circuit device according to some embodiments. FIG. 2 is a cross-sectional view taken along the line A-A in FIG. 1B according to some embodiments, and FIG. 3 is an enlarged view of a first region R1 in FIG. 2 according to some embodiments. FIGS. 1B, 2 and 3 show a group of selective elements of the BEOL structure, and some elements of the BEOL structure may not be shown in FIGS. 1B, 2 and 3.

Referring to FIGS. 1B and 2, the BEOL structure may include a lower metal wire 104, a metal via 106, and an upper metal wire 108. The lower metal wire 104 may extend longitudinally in the second direction Y, and the upper metal wire 108 may extend longitudinally in the first direction X. In some embodiment, the upper metal wire 108 may traverse multiple lower metal wires 104. A metal via 106 may overlap both the lower metal wire 104 and the upper metal wire 108 in the third direction Z and may contact both the lower metal wire 104 and the upper metal wire 108. Specifically, a lower surface 106L of the metal via 106 may contact the lower metal wire 104, and an upper surface 106U of the metal via 106 may contact the upper metal wire 108. In some embodiments, the lower metal wire 104 and the metal via 106 may be formed by the same material, and thus an interface between the lower metal wire 104 and the metal via 106 may not be visible. Further, in some embodiments, the lower metal wire 104 and the metal via 106 may be different portions a single layer (e.g., a monolithic layer) and may be formed concurrently. The lower surface 106L and the upper surface 106U may be spaced apart from each other in the third direction Z. In some embodiments, an entirety of the upper surface 106U of the metal via 106 may contact the upper metal wire 108. As used herein, "an element A overlapping an element B in a direction X" (or similar language) means that there is at least one line that extends in the direction X and intersects both the elements A and B.

A lower insulating layer 206, a first insulating layer 208 and a second insulating layer 306 may be sequentially provided on the substrate 102. The lower metal wire 104 may be in (e.g., may extend through) the lower insulating layer 206, the metal via 106 may be in (e.g., may extend through) the first insulating layer 208, and the upper metal wire 108 may be in (e.g., may extend through) the second insulating layer 306. A first adhesion layer 202 may be provided on a lower surface of the lower metal wire 104 and may separate the lower metal wire 104 from an underlying structure (e.g., the FEOL/MEOL structure 120 in FIG. 1A). Although FIG. 2 illustrates that the first adhesion layer 202 contacts the substrate 102, an FEOL/MEOL structure (e.g., the FEOL/MEOL structure 120 in FIG. 1A) may be provided between the substrate 102 and the first adhesion layer 202. A first barrier layer 204 may also extend between the lower metal wire 104 and the lower insulating layer 206 and may separate the lower metal wire 104 from the lower insulating layer 206. The first barrier layer 204 may extend between the metal via 106 and the first insulating layer 208 and may separate the metal via 106 from the first insulating layer 208. A second adhesion layer 302 may be provided on a lower surface of the upper metal wire 108 and may separate the upper metal wire 108 from the first insulating layer 208. The second adhesion layer 302 may not extend between the metal via 106 and the upper metal wire 108. A second barrier layer 304 may extend between the upper metal wire 108 and the second insulating layer 306 and may separate the upper metal wire 108 from the second insulating layer 306. The second barrier layer 304 may not extend between the metal via 106 and the upper metal wire 108.

Referring to FIG. 3, an upper portion 204P of the barrier layer 204 may extend upwardly beyond a lower surface 108L (e.g., a lowermost surface) of the upper metal wire 108 and thus may be in the upper metal wire 108, as illustrated in FIG. 3. An upper portion 106P of the metal via 106 may also be in the upper metal wire 108 and shares an XY plane with the upper metal wire 108, as illustrated in FIG. 3. Stated differently, the upper portion 106P of the metal via 106 may overlap with the upper metal wire 108 in both the first direction X and the second direction Y. The lower surface 108L of the upper metal wire 108 may be closer than an upper surface 204U (e.g., an uppermost surface) of the barrier layer 204 to the substrate 102. Further, an upper surface 208U of the first insulating layer 208 may be closer than the upper surface 204U of the barrier layer 204 to the substrate 102. The upper surface 204U of the barrier layer 204 may contact the upper metal wire 108. The upper portion 204P of the barrier layer 204 may contact an upper portion 302P of the second adhesion layer 302. Specifically, a side surface 204S (also referred to as an outer side surface) of the upper portion 204P of the barrier layer 204 may contact the upper portion 302P of the second adhesion layer 302. The upper portion 302P of the second adhesion layer 302 may separate the side surface 204S of the upper portion 204P of the barrier layer 204 from the upper metal wire 108. The second adhesion layer 302 may contact the lower surface 108L of the upper metal wire 108.

The substrate 102 may include semiconductor material(s), for example, Si, Ge, SiGe, GaP, GaAs, SiC, SiGeC and/or InP and/or may include insulating material(s), for example, silicon oxide, silicon oxynitride, silicon nitride, silicon carbonitride and/or a low-k material. In some embodiments, the substrate 102 may be a bulk substrate (e.g., a silicon wafer), a semiconductor on insulator (SOI) substrate or an insulating layer (e.g., a monolithic insulating layer). The low-k material may include, for example, SiCOH, fluorine-doped silicon oxide, organosilicate glass, carbon-doped oxide, porous silicon dioxide, porous organosilicate glass, spin-on organic polymeric dielectrics and/or spin-on silicon based polymeric dielectric.

The lower metal wire 104, the metal via 106 and the upper metal wire 108 may include independently a metal (e.g., ruthenium (Ru), molybdenum (Mo), tungsten (W), aluminum (Al) and/or copper (Cu)). In some embodiments, the lower metal wire 104, the metal via 106 and the upper metal wire 108 may include the same material (e.g., ruthenium (Ru) and/or molybdenum (Mo)). In some other embodiments, at least one of the lower metal wire 104, the metal via 106 and the upper metal wire 108 may include a material different from the remaining elements.

The first adhesion layer 202, the second adhesion layer 302, the first barrier layer 204 and the second barrier layer 304 may include a layer including nitrogen (e.g., a SiN layer, a SiCN layer, a TiN layer and/or a TaN layer). In some embodiments, the first adhesion layer 202 and the second adhesion layer 302 may include material(s) different from the first barrier layer 204 and the second barrier layer 304. For example, the first adhesion layer 202 and the second adhesion layer 302 may include a conductive layer (e.g., a TiN layer and/or a TaN), and the first barrier layer 204 and the second barrier layer 304 may include an insulating layer (e.g., a SiN layer and/or a SiCN layer). For example, each of the first barrier layer 204 and the second barrier layer 304 may include a barrier layer (e.g., a TiN layer and/or a TaN) and a conductive liner (e.g., a Co layer), and the conductive liner may extend between the barrier layer of the each of the first barrier layer 204 and the second barrier layer 304 and a conductive element (e.g., the lower metal wire 104, the metal via 106 and the upper metal wire 108). In some embodiments, the first adhesion layer 202, the second adhesion layer 302, the first barrier layer 204 and the second barrier layer 304 may be omitted. In some embodiments, the each of the first barrier layer 204 and the second barrier layer 304 may have a thickness about two times a thickness of each of first adhesion layer 202, the second adhesion layer 302.

Each of the lower insulating layer 206, the first insulating layer 208 and the second insulating layer 306 may include an insulating material (e.g., SiO, SiN, SiON or low-k material). The lower insulating layer 206, the first insulating layer 208 and the second insulating layer 306 may include same material(s) or different material(s). The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

As illustrated in FIG. 3, an interface 107 between the metal via 106 and the upper metal wire 108 may be devoid of the second adhesion layer 302, the first barrier layer 204 and the second barrier layer 304, and the interface 107 between the metal via 106 and the upper metal wire 108 may be devoid of nitrogen.

Figure 4:
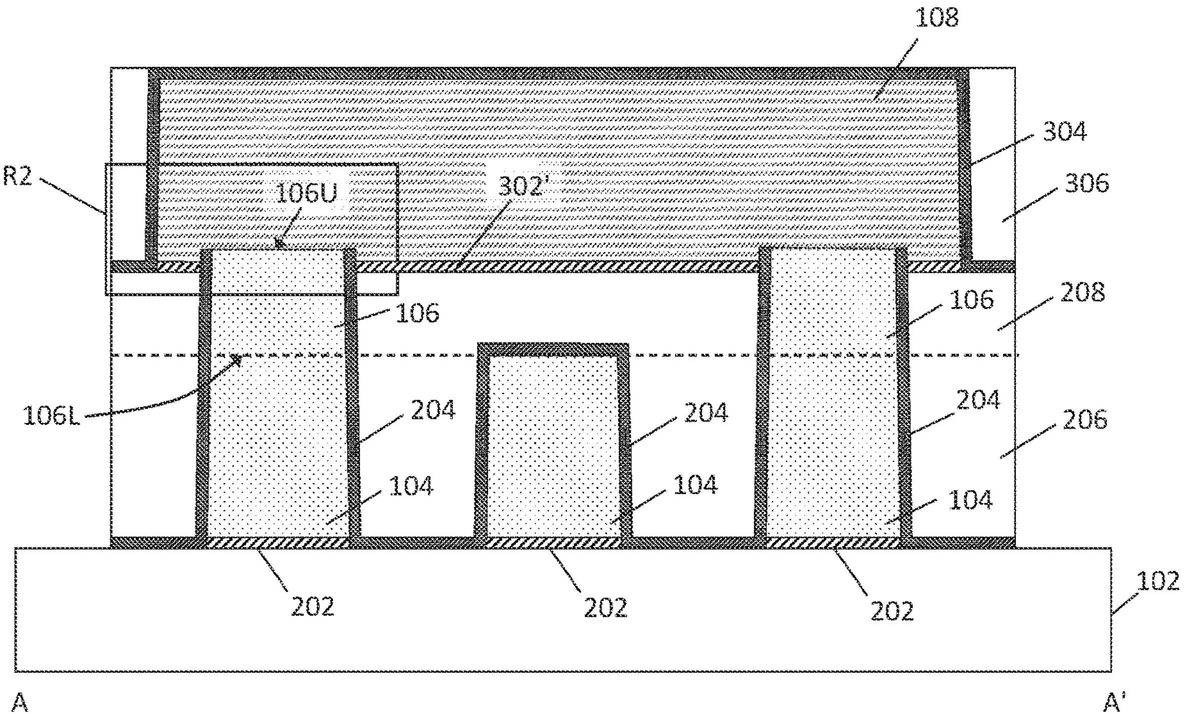
FIG. 4 is a cross-sectional view taken along the line A-A in FIG. 1B according to some embodiments.
Figure 5:
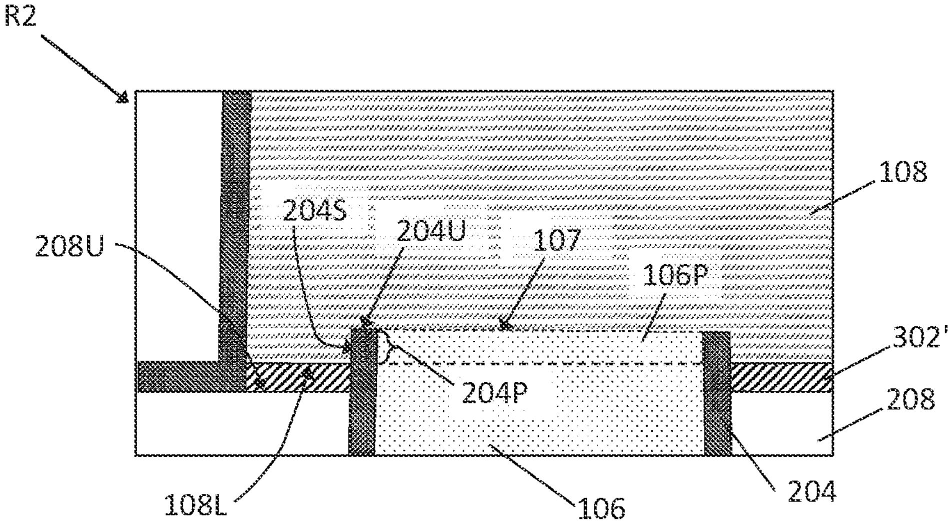
FIG. 5 is an enlarged view of a second region R2 in FIG. 4 according to some embodiments.

FIG. 4 is a cross-sectional view taken along the line A-A in FIG. 1B according to some embodiments, and FIG. 5 is an enlarged view of a second region R2 in FIG. 4 according to some embodiments. A cross-sectional view illustrated in FIGS. 4 and 5 is similar to the cross-sectional view illustrated in FIGS. 2 and 3 with a primary difference being that a second adhesion layer 302' does not include an upper portion (e.g., the upper portion 302P in FIG. 3) protruding from a horizontal portion of the second adhesion layer 302, and a side surface 204S of the upper portion 204P of the barrier layer 204 may contact the upper metal wire 108. An upper portion 204P of the barrier layer 204 may extend upwardly beyond a lower surface 108L (e.g., a lowermost surface) of the upper metal wire 108 and thus may be in the upper metal wire 108, as illustrated in FIG. 5. An upper portion 106P of the metal via 106 may also be in the upper metal wire 108, as illustrated in FIGS. 4 and 5. The lower surface 108L of the upper metal wire 108 may be closer than an upper surface 204U (e.g., an uppermost surface) of the barrier layer 204 to the substrate 102, and an upper surface 208U of the first insulating layer 208 may be closer than the upper surface 204U of the barrier layer 204 to the substrate 102, as illustrated in FIGS. 4 and 5.

Figure 6:
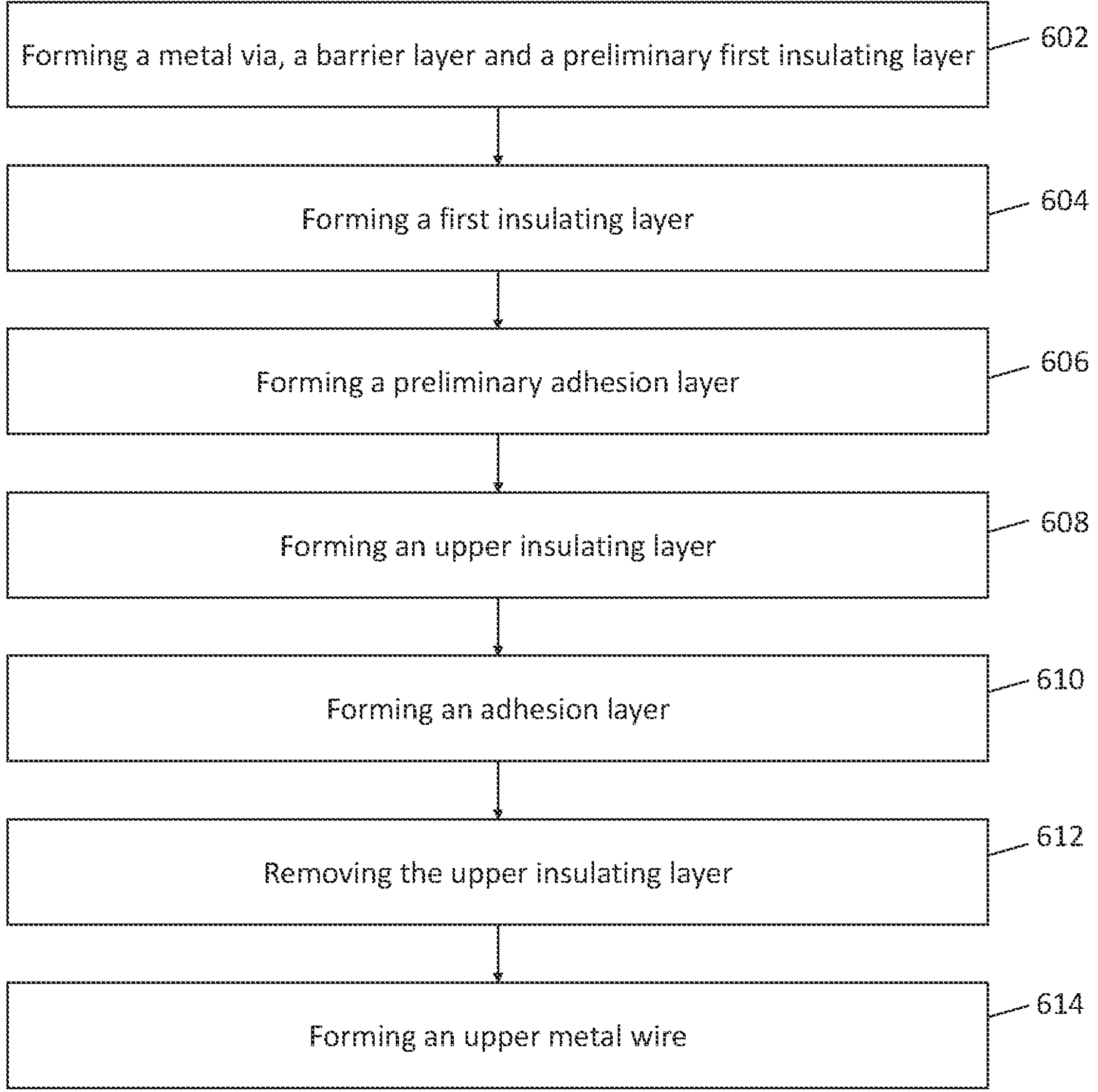
FIG. 6 is a flow chart of methods of forming an integrated circuit device according to some embodiments.

FIG. 6 is a flow chart of methods of forming an integrated circuit device according to some embodiments. FIGS. 7 through 16 are cross-sectional views, taken along the line A-A in FIG. 1B, illustrating methods of forming an integrated circuit device according to some embodiments. Specifically, FIGS. 7 through 16 are cross-sectional views illustrating methods of forming the integrated circuit device illustrated in FIGS. 4 and 5.

Figure 7:
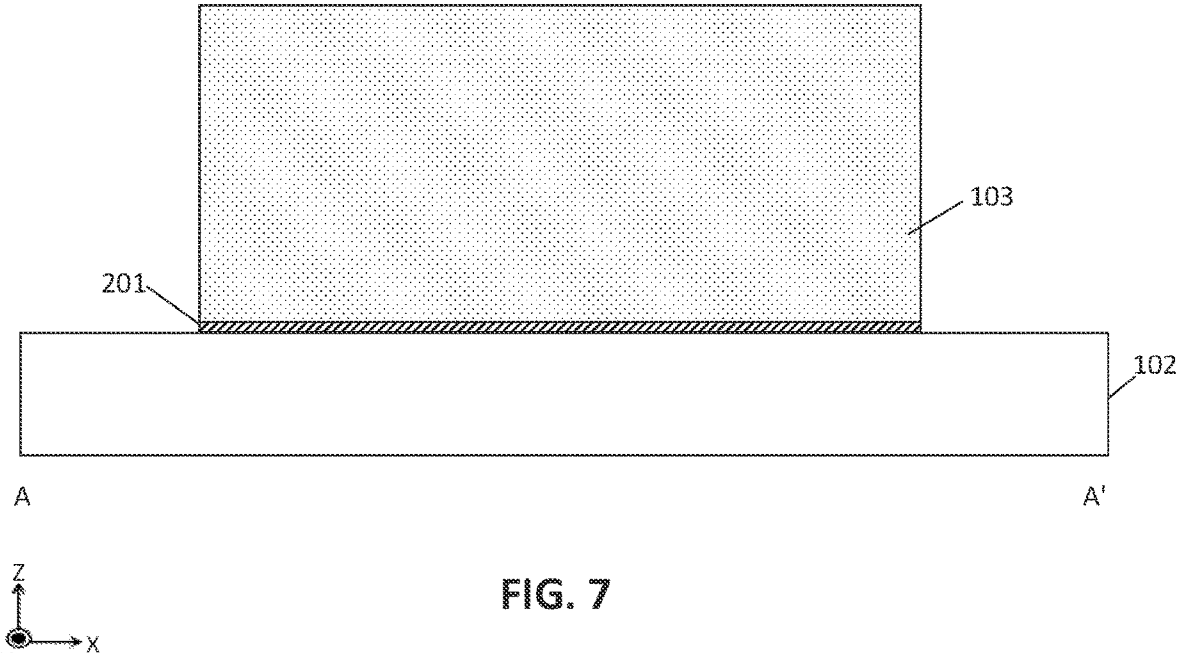
FIGS. 7 through 16 are cross-sectional views, taken along the line A-A in FIG. 1B, illustrating methods of forming an integrated circuit device according to some embodiments.
Figure 8:
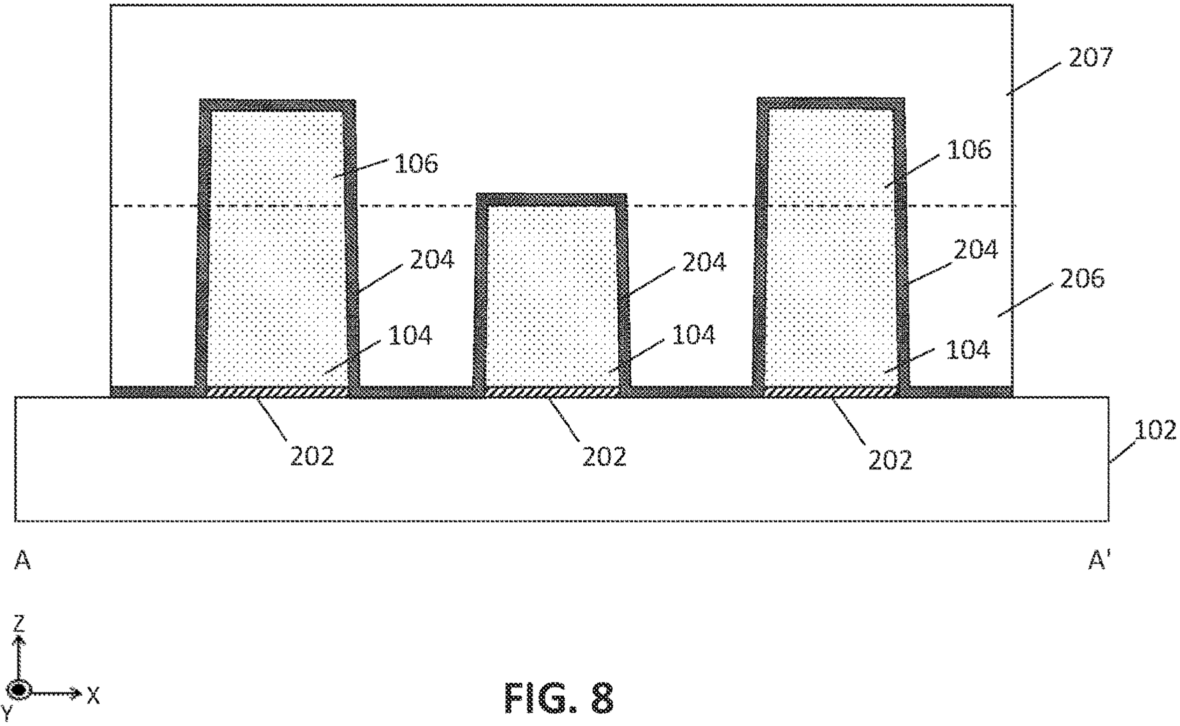

Referring to FIGS. 6, 7, 8 and 9, the methods may include forming a metal via 106, a barrier layer 204 and a preliminary first insulating layer 207 on a substrate 102 (Block 602). Referring to FIG. 7, a preliminary first adhesion layer 201 and a preliminary lower metal wire 103 may be formed on the substrate 102. The preliminary first adhesion layer 201 may include an upper surface contacting the preliminary lower metal wire 103. Referring to FIG. 8, a first adhesion layer 202 and a lower metal wire 104 may be formed on the substrate 102 by patterning the preliminary first adhesion layer 201 and the preliminary lower metal wire 103. The metal via 106 may be formed on the lower metal wire 104. In some embodiments, the metal via 106 may also be formed by patterning the preliminary lower metal wire 103. A first barrier layer 204 may be formed along outer surfaces of the first adhesion layer 202, the lower metal wire 104 and the metal via 106. In some embodiments, the first barrier layer 204 may contact the outer surfaces of the first adhesion layer 202, the lower metal wire 104 and the metal via 106. A lower insulating layer 206 and a preliminary first insulating layer 207 may be formed on the substrate 102. The lower metal wire 104 may be provided in the lower insulating layer 206, and the metal via 106 may be provided in the preliminary first insulating layer 207. The first barrier layer 204 may extend between the lower metal wire 104 and the lower insulating layer 206 and may also extend between the metal via 106 and the preliminary first insulating layer 207.

Figure 9:
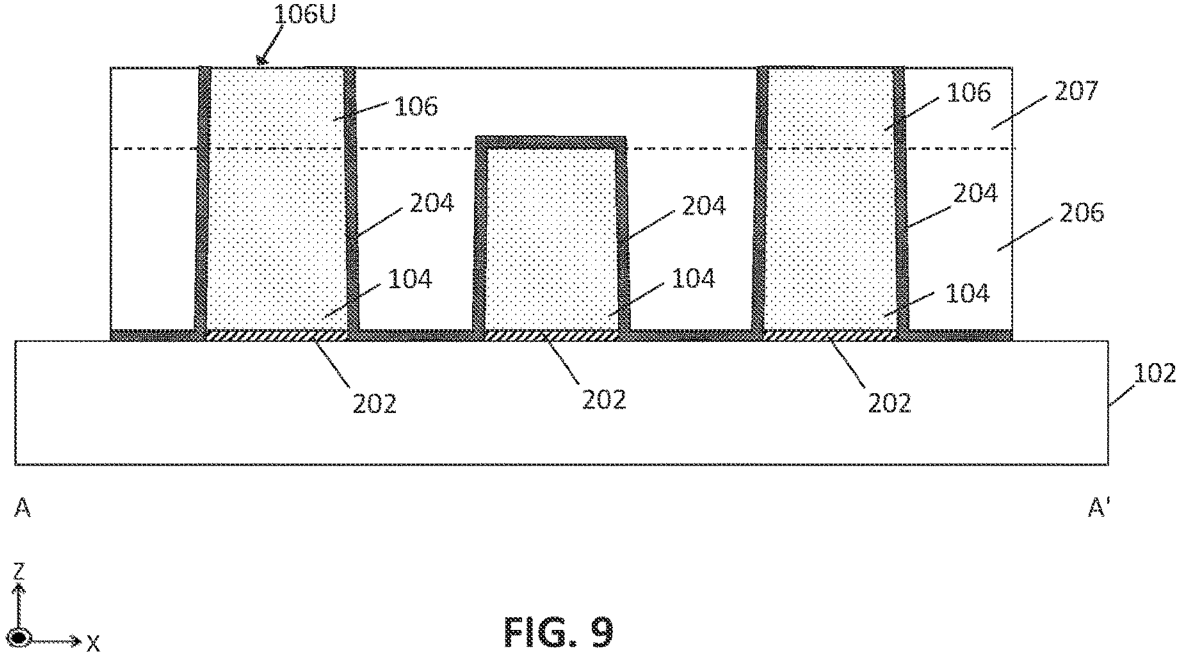

Referring to FIG. 9, an upper portion of the preliminary first insulating layer 207 and an upper portion of the first barrier layer 204 may be removed until an upper surface 106U of the metal via 106 is exposed. In some embodiments, the upper portion of the preliminary first insulating layer 207 and the upper portion of the first barrier layer 204 may be removed by sequentially performing a chemical mechanical polishing (CMP) process and an etching process (e.g., an anisotropic etching process). For example, a CMP process may be performed until the upper portion of the first barrier layer 204 is exposed and then an etching process may be performed to remove the upper portion of the first barrier layer 204 and a portion of the preliminary first insulating layer 207 surrounding the upper portion of the first barrier layer 204. The upper surface 106U of the metal via 106 and an upper surface of the preliminary first insulating layer 207 may be coplanar with each other after the upper portion of the preliminary first insulating layer 207 is removed and may be at an equal height from the substrate 102 in the third direction Z.

Figure 10:
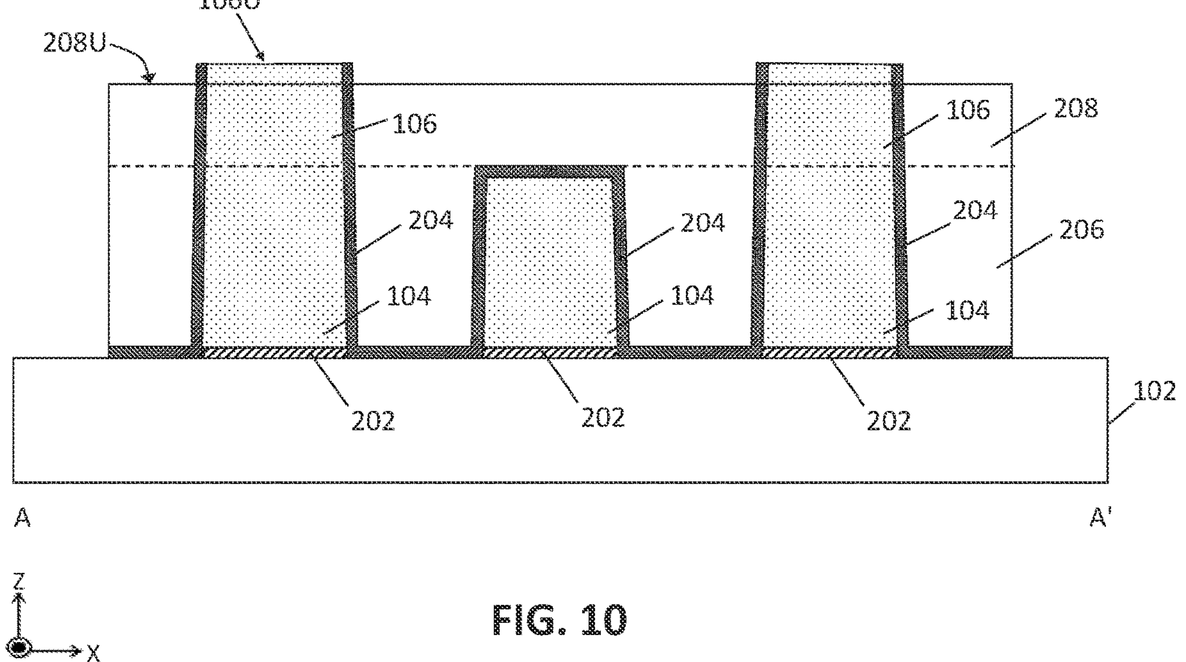

Referring to FIGS. 6 and 10, the methods may also include forming a first insulating layer 208 (Block 604). The first insulating layer 208 may be formed by removing an upper portion of the preliminary first insulating layer 207. Each of the metal via 106 and the first barrier layer 204 may include a portion that protrudes upwardly beyond an upper surface 208U of the first insulating layer 208, and the first insulating layer 208 may expose those portions of the metal via 106 and the first barrier layer 204.

Figure 11:
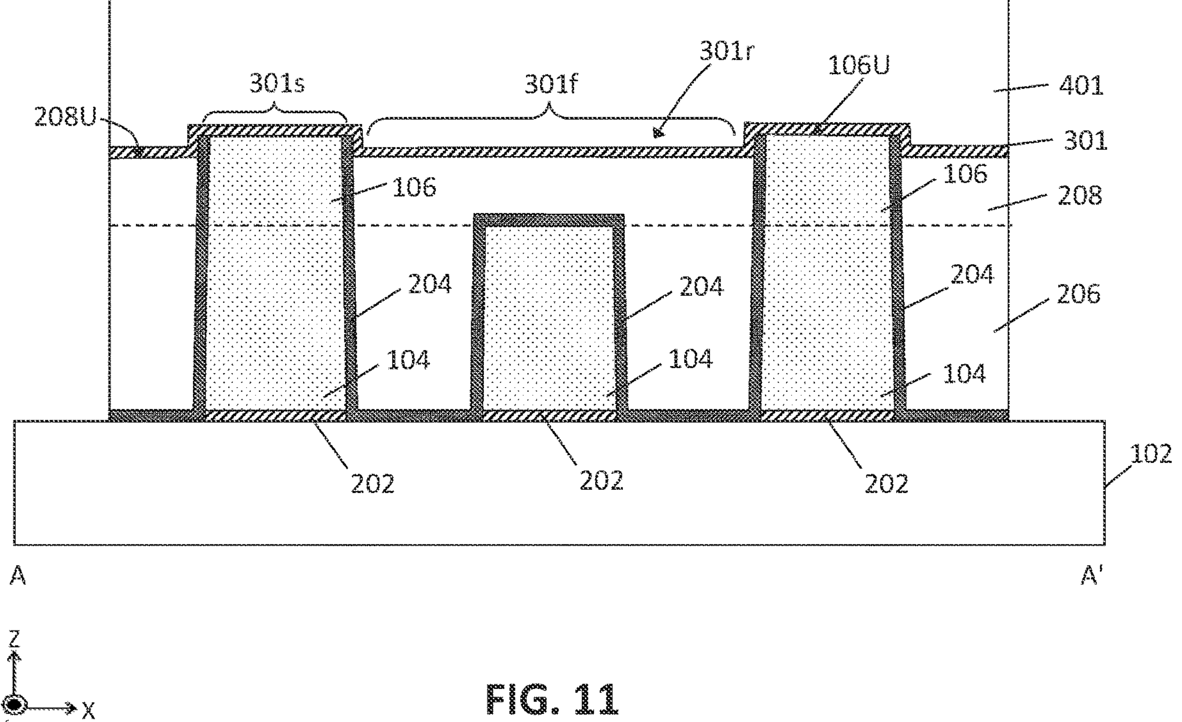

Referring to FIGS. 6 and 11, a preliminary adhesion layer 301 may be formed on (e.g., conformally formed on) the first insulating layer 208 and the metal via 106 (Block 606). In some embodiments, the preliminary adhesion layer 301 may have a uniform thickness along an upper surface 208U of the first insulating layer 208 and an upper surface 106U of the metal via 106, as illustrated in FIG. 11. The preliminary adhesion layer 301 may contact the upper surface 208U of the first insulating layer 208 and the upper surface 106U of the metal via 106. The preliminary adhesion layer 301 may include a first portion 301*f* formed on (e.g., contacting) the upper surface 208U of the first insulating layer 208 and a second portion 301*s* formed on (e.g., contacting) the upper surface 106U of the metal via 106. The first portion 301*f* of the preliminary adhesion layer 301 may be recessed with respect to the second portion 301*s* of the preliminary adhesion layer 301 toward the substrate 102 and may define a recess 301*r*, as illustrated in FIG. 11.

Referring to FIG. 11, a preliminary upper insulating layer 401 may be formed on the preliminary adhesion layer 301. A portion of the preliminary upper insulating layer 401 may be formed in the recess 301*r* of the preliminary adhesion layer 301. An entirety of the preliminary adhesion layer 301 may contact the preliminary upper insulating layer 401.

Figure 12:
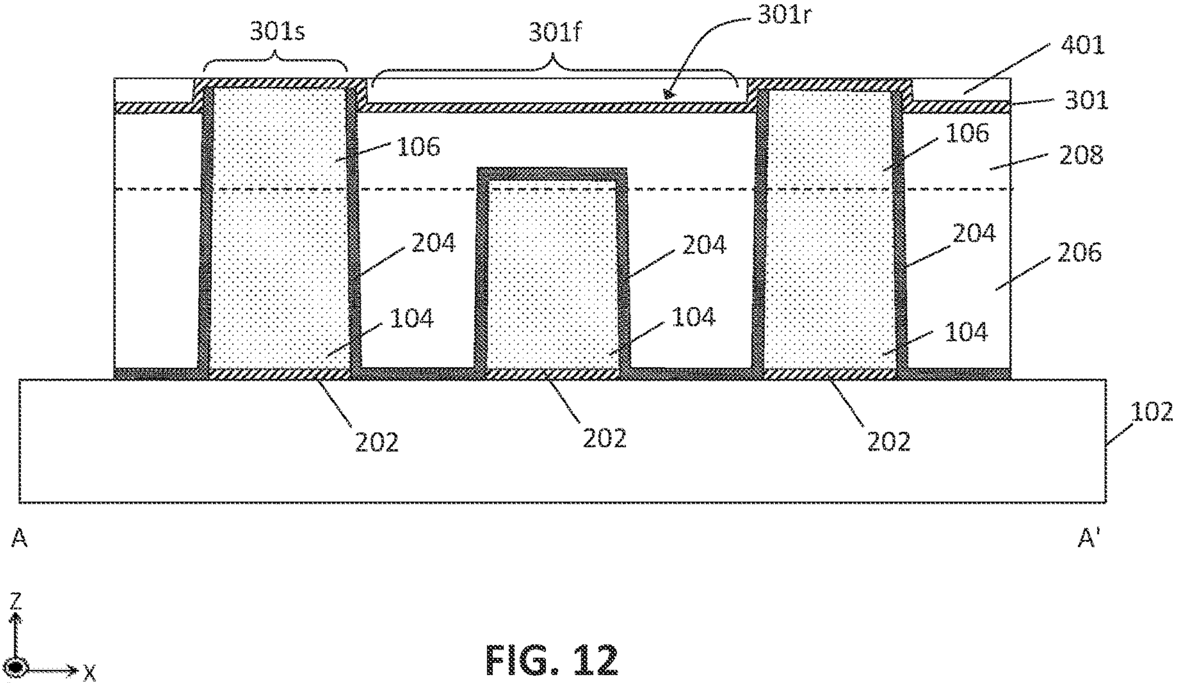

Referring to FIG. 12, an upper portion of the preliminary upper insulating layer 401 may be removed until the second portion 301*s* of the preliminary adhesion layer 301 is exposed. The preliminary upper insulating layer 401 may remain in the recess 301*r* of the preliminary adhesion layer 301. The preliminary upper insulating layer 401 may include an insulating material (e.g., SiO, SiN, SiON or low-k material).

Figure 13:
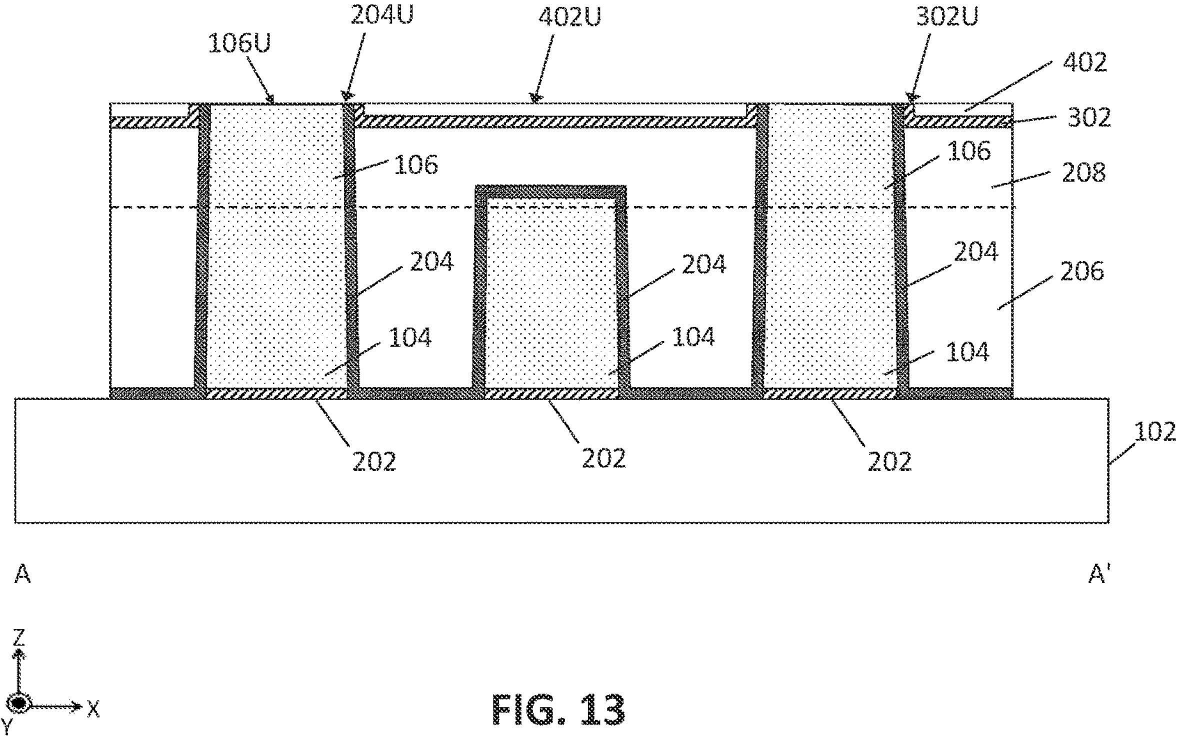

Referring to FIGS. 6 and 13, an adhesion layer 302 may be formed (Block 610). In some embodiments, an upper portion of the preliminary upper insulating layer 401 and the second portion 301*s* of the preliminary adhesion layer 301 may be removed until an upper surface 106U of the metal via 106 is exposed, thereby forming the adhesion layer 302 and an upper insulating layer 402. The upper portion of the preliminary upper insulating layer 401 and the second portion 301*s* of the preliminary adhesion layer 301 may be removed by, for example, a planarization process (e.g., a polishing process and/or an etching process). For example, a chemical mechanical polishing (CMP) process and/or an anisotropic etch process may be performed to remove the upper portion of the preliminary upper insulating layer 401 and the second portion 301*s* of the preliminary adhesion layer 301. The adhesion layer 302 and the upper insulating layer 402 may expose the upper surface 106U of the metal via 106. In some embodiments, an upper surface 402U of the upper insulating layer 402, the upper surface 106U of the metal via, an upper surface 204U of the first barrier layer 204, and an upper surface 302U of the adhesion layer 302 may be coplanar with each other and may be at an equal height from the substrate 102 in the third direction Z, as illustrated in FIG. 13.

Figure 14:
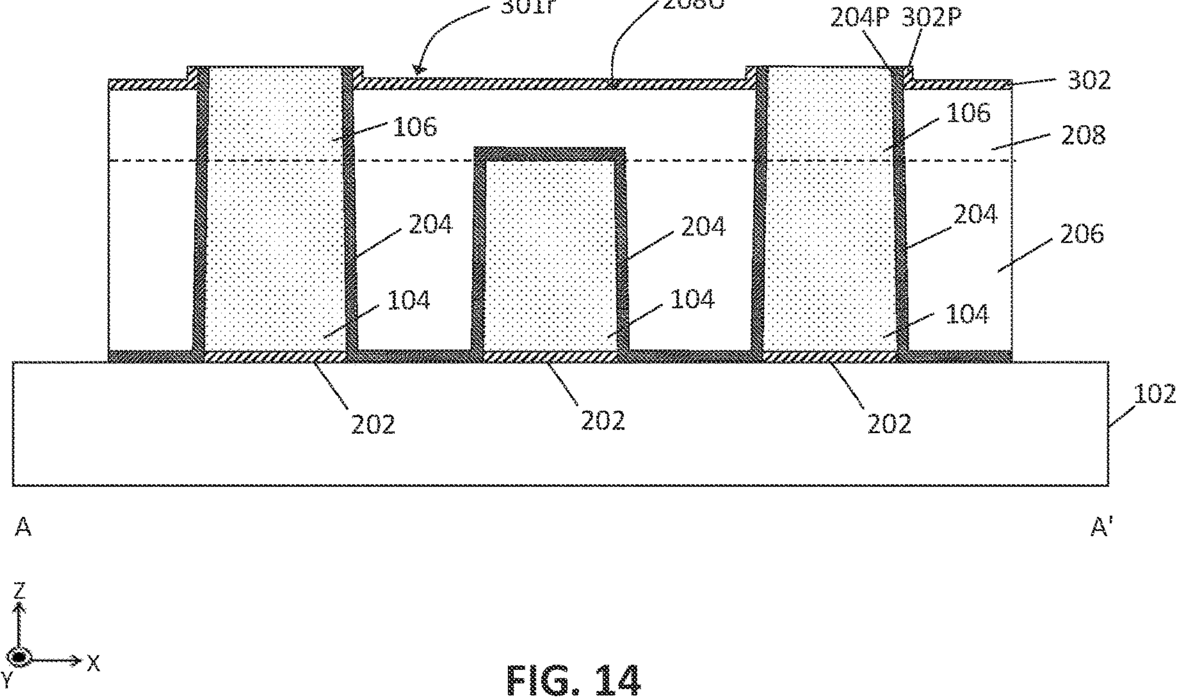

Referring to FIG. 14, the upper insulating layer 402 may be removed such that the adhesion layer 302 may be exposed. In some embodiments, an entirety of an upper surface of the adhesion layer 302 may be exposed. The first barrier layer 204 may include an upper portion 204P that is provided above the upper surface 208U of the first insulating layer 208, and the adhesion layer 302 may include an upper portion 302P that is provided above the upper surface 208U of the first insulating layer 208. The upper portion 204P of the first barrier layer 204 and the upper portion 302P of the adhesion layer 302 may protrude upwardly beyond the upper surface 208U of the first insulating layer 208, as illustrated in FIG. 14. The upper portion 204P of the first barrier layer 204 may separate a side surface 204S (also referred to as an outer side surface) of the upper portion 204P of the first barrier layer 204 from the upper metal wire 108.

Figure 15:
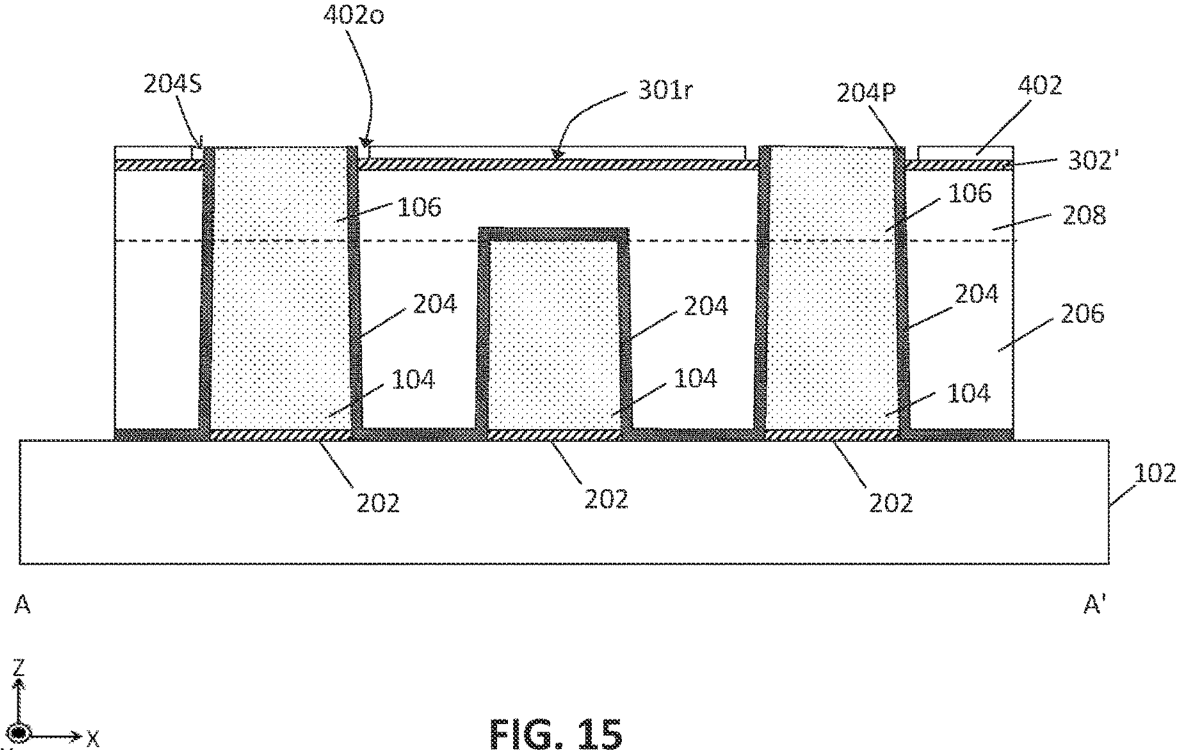

Referring to FIG. 15, the upper portion 302P of the adhesion layer 302' may optionally be removed, thereby forming an opening 4020 (also referred to as a recess) defined by the adhesion layer 302', the first barrier layer 204 and the upper insulating layer 402. The opening 4020 may expose a portion (e.g., a portion of the upper surface) of the adhesion layer 302', the side surface 204S of the upper portion 204P of the first barrier layer 204, and a side surface of the upper insulating layer 402. In some embodiment, the process illustrated in FIG. 15 may be omitted to form the integrated circuit device illustrated in FIGS. 2 and 3.

Figure 16:
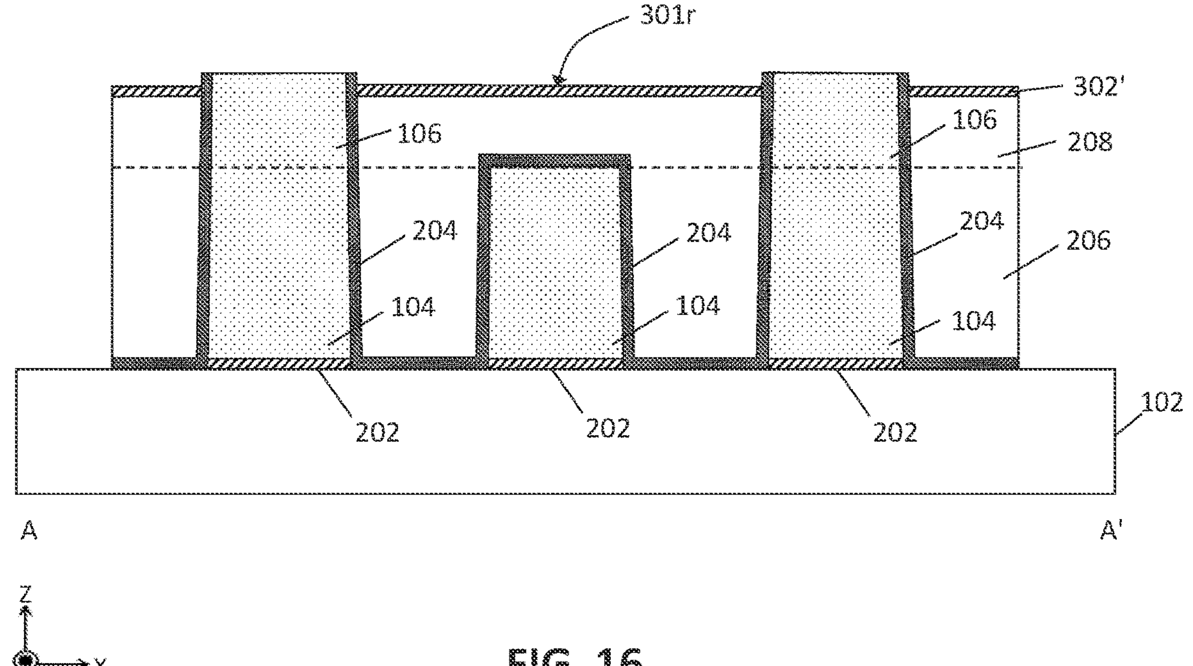

Referring to FIGS. 6 and 16, the upper insulating layer 402 may be removed (Block 612). The upper insulating layer 402 may be removed until the adhesion layer 302' is exposed and the recess 301*r* is exposed. In some embodiments, an entirety of an upper surface of the adhesion layer 302' may be removed, as illustrated in FIG. 16.

Referring to FIGS. 4 and 6, an upper metal wire 108 may be formed on the adhesion layer 302' (Block 614). The upper metal wire 108 may contact the adhesion layer 302' and the upper surface 106U of the metal via 106. A second insulating layer 306 may be formed on the adhesion layer 302', and the upper metal wire 108 may be provided in the second insulating layer 306. A second barrier layer 304 extending between the upper metal wire 108 and the second insulating layer 306 may be formed.

In some embodiments, the processes illustrated in FIGS. 15 and 16 may be omitted and thus the upper portion 302P of the adhesion layer 302 in FIG. 14 may not be removed, thereby the integrated circuit device illustrated in FIGS. 2 and 3 may be formed.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising." "includes" and/or "including." when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:

a lower metal wire;

an upper metal wire on the lower metal wire;

a metal via between the lower metal wire and the upper metal wire, the metal via comprising a lower surface that contacts the lower metal wire and an upper surface that directly contacts the upper metal wire; and a barrier layer extending on a side surface of the metal via, wherein an upper portion of the barrier layer extends upwardly beyond a lower surface of the upper metal wire.

2. The integrated circuit device of claim 1, wherein a side surface of the upper portion of the barrier layer contacts the upper metal wire.

3. The integrated circuit device of claim 2, wherein the barrier layer comprises nitrogen.

4. The integrated circuit device of claim 3, wherein an interface between the upper surface of the metal via and the upper metal wire is devoid of nitrogen.

5. The integrated circuit device of claim 1, further comprising an adhesion layer contacting the lower surface of the upper metal wire, wherein the adhesion layer comprises a material different from the barrier layer.

6. The integrated circuit device of claim 5, wherein a side surface of the upper portion of the barrier layer contacts the adhesion layer.

7. The integrated circuit device of claim 5, wherein the adhesion layer comprises a portion that separates a side surface of the upper portion of the barrier layer from the upper metal wire.

8. The integrated circuit device of claim 1, each of the metal via and the upper metal wire comprises ruthenium (Ru) or molybdenum (Mo).

9. An integrated circuit device comprising:

an insulating layer;

a metal via in the insulating layer;

an upper metal wire on the insulating layer and the metal via, an upper surface of the metal via contacting the upper metal wire, wherein the metal via and the upper metal wire comprise a same metal material; and a barrier layer extending on a side surface of the metal via, wherein an upper portion of the barrier layer is in the upper metal wire.

10. The integrated circuit device of claim 9, wherein a side surface of the upper portion of the barrier layer contacts the upper metal wire.

11. The integrated circuit device of claim 9, wherein an entirety of the upper surface of the metal via contacts the upper metal wire.

12. The integrated circuit device of claim 9, wherein an interface between the upper surface of the metal via and the upper metal wire is devoid of nitrogen.

13. The integrated circuit device of claim 9, further comprising an adhesion layer contacting a lower surface of the upper metal wire, wherein the adhesion layer comprises a material different from the barrier layer.

14. The integrated circuit device of claim 13, wherein a side surface of the upper portion of the barrier layer contacts the adhesion layer.

15. The integrated circuit device of claim 13, wherein the adhesion layer comprises a portion that separates a side surface of the upper portion of the barrier layer from the upper metal wire.

16. A method of forming an integrated circuit device, the method comprising:

forming a metal via, a barrier layer and a first insulating layer, wherein the metal via and the barrier layer is in the first insulating layer, and the barrier layer extends between the first insulating layer and opposing side surfaces of the metal via, and wherein upper portions of the metal via and the barrier layer protrude upwardly beyond an upper surface of the first insulating layer;

forming an adhesion layer on the upper surface of the first insulating layer, wherein the adhesion layer does not overlap an upper surface of the metal via; and forming an upper metal wire on the metal via, the barrier layer and the adhesion layer, the upper metal wire contacting the upper surface of the metal via and an upper surface of the barrier layer, wherein the metal via and the upper metal wire comprise a same metal material.

17. The method of claim 16, wherein forming the adhesion layer comprises:

forming a preliminary adhesion layer on the upper surface of the first insulating layer and the upper surfaces of the metal via and the barrier layer, wherein a first portion of the preliminary adhesion layer formed on the upper surface of the first insulating layer is recessed with respect to a second portion of the preliminary adhesion layer formed on the upper surfaces of the metal via and the barrier layer; and removing the second portion of the preliminary adhesion layer until exposing the upper surface of the metal via and the upper surface of the barrier layer.

18. The method of claim 17, wherein a portion of the adhesion layer separates a side surface of the upper portion of the barrier layer from the upper metal wire.

19. The method of claim 17, wherein a side surface of the upper portion of the barrier layer is exposed after the second portion of the preliminary adhesion layer is removed.

20. The method of claim 19, wherein the upper metal wire contacts the side surface of the upper portion of the barrier layer.

* * * * *